United States Patent [19]

Lindgren

[11] 3,939,365
[45] Feb. 17, 1976

[54] PULSE PEAK DETECTOR

[76] Inventor: William A. Lindgren, 9300 Gunpowder Place, Gaithersburg, Md. 20760

[22] Filed: July 10, 1974

[21] Appl. No.: 487,307

[52] U.S. Cl............ 307/235 A; 307/235 K; 328/146; 328/151
[51] Int. Cl.² ............................................ H03K 5/20
[58] Field of Search..... 307/235 R, 235 A; 328/150, 328/151, 146–149, 135

[56] References Cited
UNITED STATES PATENTS

| | | | |
|---|---|---|---|
| 2,222,172 | 11/1940 | Dimmick | 328/150 X |
| 3,541,457 | 11/1970 | Leighty et al. | 328/150 |

*Primary Examiner*—John Zazworsky
*Attorney, Agent, or Firm*—Roylance, Abrams, Berdo & Kaul

[57] ABSTRACT

A pulse peak detector for generating a DC signal proportional to the peak amplitude of applied short duration input pulses of a repetitive train, includes a signal input circuit to which the pulses are applied, a first storage capacitor, a differential comparator connected to the input circuit and to the pulse storage capacitor for producing a saturation output signal having a time duration equal to the time during which the input pulse exceeds the amplitude of the level stored on the capacitor. The output pulse thus generated is coupled to an error amplifier and a second storage capacitor at the output of that amplifier, the second capacitor being DC coupled to the first. The time constants of the capacitors and their associated resistive charging circuits are selected so that the coupling circuit and the second storage capacitor has a time constant which is long relative to the repetition rate of the applied signals. The first storage capacitor and its charging circuit has a significantly shorter time constant so that the second capacitor tends to replenish the charge on the first and also produces a DC output level which is representative of the peak amplitude of applied input signals.

4 Claims, 8 Drawing Figures

PULSE PEAK DETECTOR

This invention relates to pulse detector circuits and, specifically, to pulse peak detector circuits.

It is well known that a simple integrator circuit provides an output signal which is representative of some parameter of the input signal, but that this parameter is generally the RMS or an average value, regardless of the waveform or peak amplitude of the input. While this kind of converter is frequently useful, it is also desirable to be able to develop a signal which is truly and accurately representative of the peak amplitude of the input signal.

The ultrafast pulse peak converter to be described in detail below produces a DC voltage having an amplitude accurately representative of the peak amplitude of the applied pulses. This pulse peak converter is particularly valuable for use in conjunction with pulses that are encountered in the field of pulse-echo and pulse-transmission ultrasonic systems. These pulses typically have rise times in the order of 10 ns, ($10^{-9}$ secs. = 1 ns) pulse widths of 20 ns, and repetition rates of 1 khz.

BRIEF DESCRIPTION OF DRAWINGS

The somewhat idealized shape of a typical ultrasonic pulse is shown in FIG. 1 wherein the X axis 11 represents time and is calibrated in nanoseconds and the Y axis 12, representing pulse amplitude, is calibrated in voltage using arbitrary units. Two complete and identical ultrasonic pulses 3 and 4 are seen in FIG. 1. The pulses are separated in time by 1/1000 sec. and therefore represent, at least for the two pulses shown, a reoccurrence or repetition rate of 1 khz. Solid line 15 is a typical idealized waveform of, for example, an ultrasonic pulse encountered in the field of ultrasonic systems wherein the waveform is a plot of the voltage generated by a transducer responding to an impinging pulse of sonic energy. As shown, the waveform consists of a first positive going portion having a peak amplitude 16, followed by a negative going portion 17, which in turn is followed by a much larger positive cycle 18 with a peak amplitude 19. It is desired that the converter produce a DC voltage, the amplitude of which accurately represents the peak amplitude of the positive peak 16 or the positive peak 18 if, in fact, the positive peak 18 exists and has an amplitude greater than the peak 16. In FIG. 1, solid line 19 represents the amplitude of the DC voltage which is an accurate analog of the peak amplitude of the voltage represented by the peak of the waveform 18.

Figure 1:
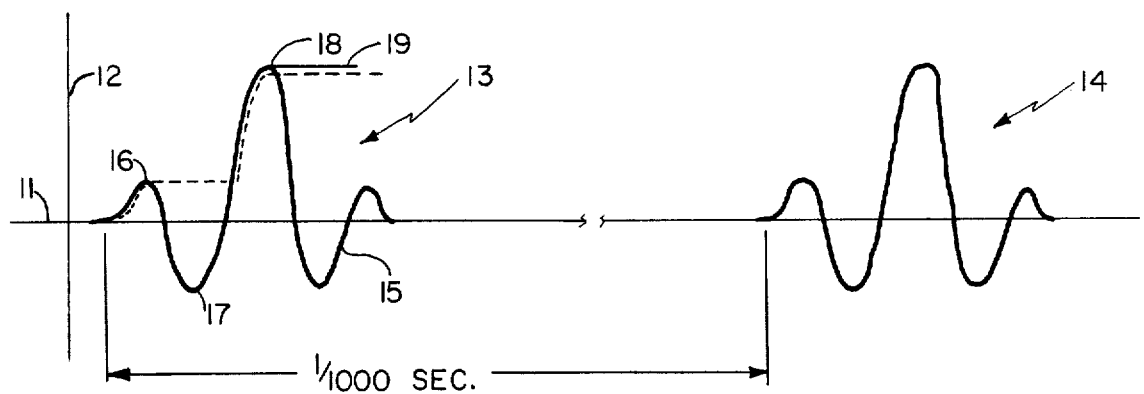
FIG. 1 is a waveform diagram showing pulses the peak amplitudes of which are to be detected.
Figure 2:
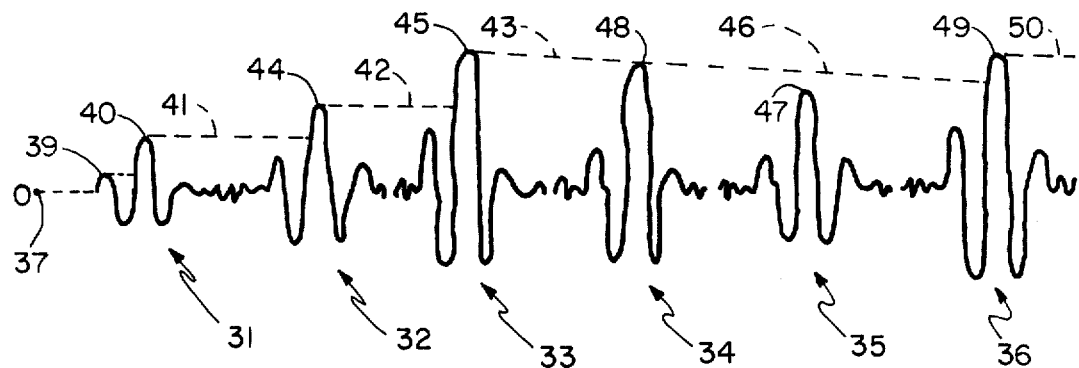
FIG. 2 is a waveform diagram showing a train of pulses the peak amplitudes of which are to be detected.

The discussion to follow describes a converter that produces a positive DC voltage that accurately represents the positive peak amplitude of a very brief applied signal voltage. The novel technique can be adapted to provide negative DC voltages accurately representative of the negative going peak pulse or may produce a DC voltage accurately representative of the peak to peak amplitude, i.e., a DC voltage equal to the absolute magnitude of the maximum positive peak amplitude plus the maximum negative peak amplitude. The embodiments producing the negative DC analog or the peak to peak analog will be described hereinafter. As used herein the term DC voltage or DC analog refers to a voltage characterized by the fact that it is continuous and has a constant steady state value for a period of time which is long compared with the pulse duration with respect to the time measured between cycles, i.e., 1/1000 sec. in the example shown, and which is determined by the repetition rate. In fact, the DC voltage representative of the peak amplitude will increase as the peak amplitude of the pulses increase, if the amplitude of the pulses are increasing with time, or the DC voltage will decrease under the control of a predetermined time constant if the peak amplitude of the pulses are decreasing with time. This is shown in FIG. 2 wherein the first three pulses 31–33, in a train of pulses, successively increase in amplitude and are followed by two additional pulses 34 and 35 which successively decrease in amplitude and which are, finally, followed by pulse 36 which increases in amplitude with respect to the last pulse 35.

The dotted line 37, which represents the DC analog voltage, accurately follows the peak amplitude of the first four pulses 31–34. It will be observed that the DC voltage as represented by the dotted line 37, starting with an amplitude of 0 at the left side of FIG. 2, by action of the converter, increases to a new value accurately representative of peak 39 of pulse 31. Some brief time later and in a similar fashion the converter increases the DC analog voltage to a new value accurately representative of peak 40 of pulse 31, this new value being illustrated by section 41 of dotted line 37. In a similar fashion the converter produces a DC analog of greater amplitude as shown by lines 42 and 43 which are accurately representative of the peaks 44 and 45 of pulses 32 and 33 respectively.

It will be noticed that in each of the dotted line segments 41–43, there is a slight decrease in the amplitude of the DC analog voltage as a function of time, i.e., the line segments have a negative slope, the slope being identical for each of the line segments. The magnitude of the slopes is determined by a time constant of a preselected value which is manually set into the converter. The purpose of the time constant, and the resulting negative slope, is to permit the converter to produce a DC analog voltage which will follow the peak amplitude of pulses whose peak amplitude is decreasing with time. This is illustrated in FIG. 2 with pulses 33–36 and dotted line segment 43 and 46.

In this illustration it will be observed first that the peak amplitude 48 of pulse 34 is less than the peak amplitude 45 of pulse 33. The time constant, which has been preset into the converter, coincidentally matches the decrease in the peak amplitude 48 of pulse 34 as compared with the peak amplitude 45 of pulse 33. In regard to pulse 35, the peak amplitude 47 is considerably less than the peak amplitude 48 of pulse 34 and the predetermined time constant, which produces a slope of line segment 46, does not permit the DC analog voltage to follow the peak 47 of pulse 35. The peak amplitude 49 of pulse 36 is greater than the peak amplitude 47 of pulse 35 and it will be observed that the action of the converter is such that the DC analog voltage will increase to accurately represent the peak 49 of pulse 36 as illustrated by the dotted line segment 50 signifying an increase in the DC analog as represented by segment 46.

In the operation of the converter the time constant is chosen by experience, knowledge of the waveforms encountered, or by choosing the time constant to achieve certain characteristics of the DC analog output signal.

Figure 3:
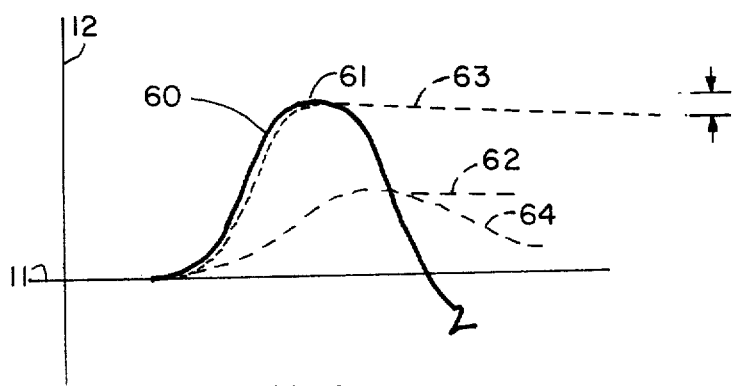
FIG. 3 is a waveform diagram showing a portion of FIG. 1, enlarged.

FIG. 3 is an enlargement of the first positive going signal portion 16 of ultrasonic pulse 13 illustrating the capability of the novel ultrafast peak pulse converter. In this figure, solid line 60 represents the first positive going portion of the applied input signal having a peak amplitude 61. Dashed line 62 represents the characteristic of a peak pulse converter that does not have sufficient capabilities to accurately follow and hold the peak value 61 of the applied pulse as represented by solid line 60. Dotted line 63 represents the DC analog voltage produced by the ultrafast peak pulse converter which has the capability of accurately sensing and holding the peak value 61 of the applied ultrasonic pulse.

The significant characteristic of this pulse, which determines in part the requirements of the converter, are the fast rise time of 10 ns and the short duration of 20 ns.

Rise time is the time interval during which the amplitude of the output voltage changes from 10 to 90% of the rising portion of the pulse.

Pulse width (or pulse duration) is the time duration of the pulse measured between 50 % amplitude levels of the rising and falling portions of the waveforms.

These values in combination with the requirements of the converter to produce a DC analog voltage accurately representative of the peak values 61, make it difficult to construct a converter without resorting to elaborate and expensive circuitry. For example, the conventional peak pulse detector will have a waveform as shown by dashed line 62 (FIG. 3) in which the detector is not able to respond to the ultrafast waveform illustrated by solid line 60. The simple expedient of trying to improve the characteristics of such a detector conventionally results in the loading of the input signal circuitry, decreasing the time constant of the detector such that the DC analog voltage output of the detector sags, as shown by dash line 64 of FIG. 3, or, alternatively, using a combination of active circuit elements with high gain and fast rise time and sufficient output power to permit their use in conjunction with large storage devices, this combination being unattractive from a cost standpoint.

Figure 4:
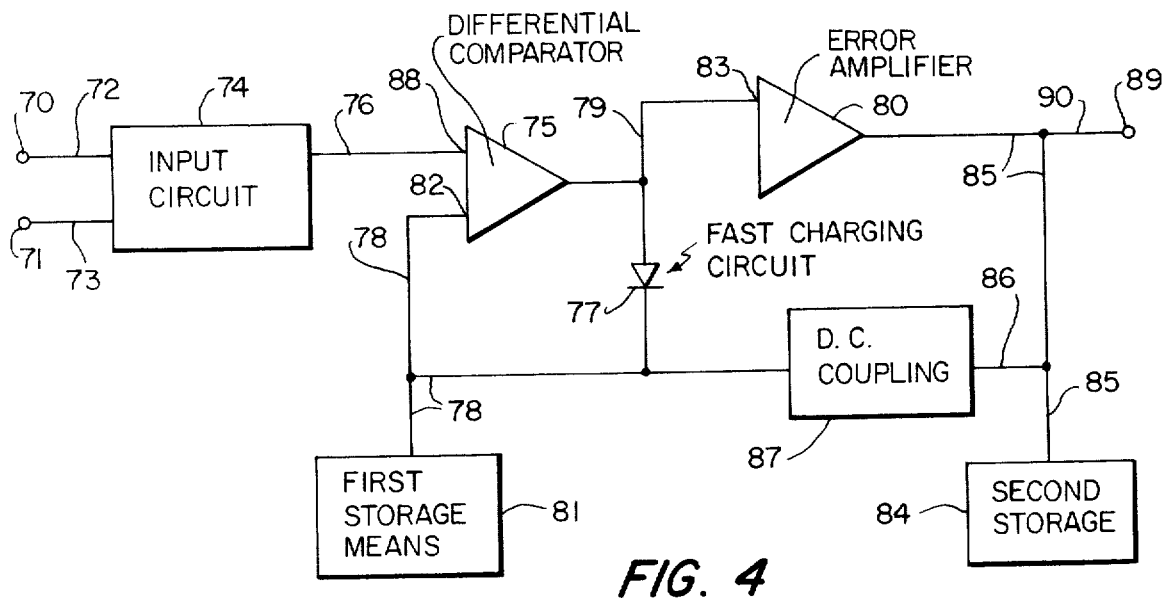
FIG. 4 is a schematic circuit diagram, in block form, of a detector circuit according to the invention.

FIG. 4 is a simplified block diagram of a circuit in accordance with the invention, this circuit employing inexpensive and conventional amplifiers in conjunction with two inexpensive capacitors used as first and second storage means. As shown in the block diagram, input terminals 70 and 71, which are connected to a source of ultrasonic pulses not shown, are connected to input circuit 74 through conductor 72 and 73. Signals from the input circuit 74 are applied to the differential comparator 75 via the conductor 76. The output voltage from the differential comparator 75 is connected via conductor 79 to both the input of error amplifier 80 and to the fast charging circuit comprising diode 77. Signals from the differential amplifier pass through diode 77 and via path 78 to both first storage means 81 and to the non-inverting input terminal 82 of differential comparator 75.

Differential signals from comparator 75 are applied to the input terminals 83 of error amplifier via conductor 79 where they are amplified and applied to second storage means 84 through conductor 85. Error signals from the output of error amplifier 80, which are held in storage by second storage means 84, are applied to the input of the DC coupling device 87 through conductor 86. To complete the circuit as shown in the simplified block diagram of FIG. 4, the signal stored by the second storage means 84 is coupled through the DC coupling device 87 and via path 78 is applied to the first storage means 81.

In operation the input circuit 74 performs first the function of coupling the supersonic pulses to the input of differential comparator 75 and secondly provides a circuit for establishing the voltage offset for differential comparator 75. In the preferred embodiment the differential comparator is an inexpensive high speed linear integrated circuit operational amplifier. With the operational amplifier connected as a differential comparator as shown in FIG. 4, the signal from the input circuit connected to the inverting input terminal 88, the output of the operational amplifier connected through the fast charging circuit comprising diode 77 to the non-inverting terminal, and with storage means 81 connected to the non-inverting terminal 82, the operational amplifier may be operated in its most advantageous mode.

That is, connected as just described, the oeprational amplifier operates with open loop gain and without loss of bandwidth of rise time, its most advantageous mode for this application. The only limitation imposed on this circuit is that the bandwidth and rise time are degraded if the output is loaded with a circuit of low impedance, the output load including first storage means 81. Therefore, in previous applications and in the application of the present invention, the differential comparator 75 is used in conjunction with a first storage means 81 which is typically a capacitor of very small value, i.e., typically a few picofarads. The circuit just described including the input circuit, differential comparator, fast charging circuit and first storage means will perform the function of detecting a peak pulse but will not perform the function of converting the peak amplitude to a DC analog voltage. The reason for this is that, if the first storage means is of low value, thus permitting fast rise time, the circuit will not function as a converter, and if the first storage means has a large value so that the circuit may function as a comparator to produce a DC analog voltage, the large value of the first storage means will degrade the performance of the operational amplifier so that sufficient rise time and bandwidth is not obtained and the peak value of the applied waveform will not be detected.

The addition of the novel circuit including the error amplifier 80, the DC coupling circuit 87, and the second storage means 84 overcomes the disadvantages just described.

As shown in FIG. 4, the error signal taken from the differential comparator 75 is further amplified by the error amplifier 80 and applied to the second storage means 84. The signal stored in the second storage means 84 is then connected through a DC coupling circuit 86 to the first storage means and, more significantly, to the non-inverting terminal of the operational amplifier differential comparator 75. With this circuit, the second storage means may have an extremely large value, for example, one microfarad, thus permitting the ultrafast peak pulse converter to produce a DC analog accurately representing the peak amplitude of the extremely fast ultrasonic pulses. The DC analog output signal which accurately represents the peak amplitude of the applied signals is provided at terminal 89 which is connected via path 90 to the output of the error amplifier 80.

Two observations regarding this circuit are significant. First, the performance requirements of the second operational amplifier performing as an error amplifier 80 are not as great as those of the operational amplifier used as the differential comparator 75; and, second, the second storage means 84 which is connected through the DC coupling circuit 87 to the non-inverting terminal 82 of differential comparator 75 does not, in the circuit just described, degrade the rise time or bandwidth performance of the differential comparator amplifier.

A detailed discussion of the circuits just described generally in relation to the simplified block diagram of FIG. 4, will be provided hereinafter in relation to the detailed schematic circuit of FIG. 5.

Figure 5:
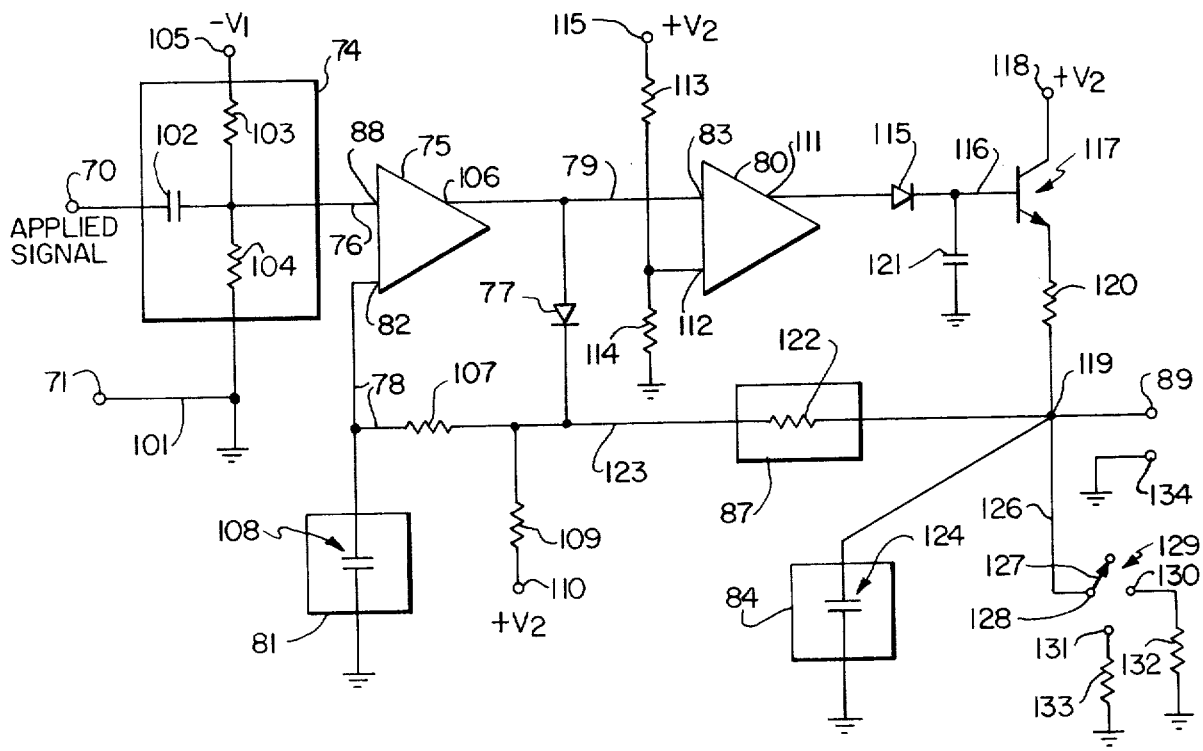
FIG. 5 is a schematic circuit diagram, partly in block form, of a detector circuit according to the invention.

FIG. 5 is a complete schematic of the ultrafast peak pulse converter. In this circuit the ultrasonic pulses are applied to terminal 70 and via the input circuit 74 to the input of terminal 88 of differential comparator 75. The common side of the applied signal is connected to terminal 71 and via path 101 to ground. Input circuit 74 includes an AC coupling capacitor 102 for preventing DC voltages from the source from being applied to the input of the differential comparator. The input circuit 74 also includes resistors 103 and 104 which are connected to a source of negative DC voltage at terminal 105 and to ground respectively and with the other end of resistors 103 and 104 having a common junction point with capacitor 102 and terminal 88 of differential comparator 75.

The function of resistors 103 and 104 is to provide a small negative bias voltage to the inverting terminal 88 of the differential comparator 75. This bias voltage counterbalances the internal voltage generated by the operational amplifier, this voltage generally being referred to as the offset voltage.

The output signal from the differential comparator 75 at terminal 106 is applied on path 79 to the input terminal 83 of the error amplifier 80 and also through diode 77 and resistor 107 to the non-inverting terminal 82 of the differential comparator 75. The non-inverting terminal 82 is also connected to the first storage means 81 comprising a capacitor of small value 108. The function of diode 77 is to unidirectionally couple the output terminal 106 to non-inverting input terminal 82 of the differential comparator 75. The function of resistor 107 is as a parasitic suppressor which helps to eliminate high frequency ringing caused by the transient characteristics of the signals applied thereto. Resistor 109 is connected to the junction between diode 77 and resistor 107 at one end and to terminal 110, which is connected to a positive source of DC voltage V2, at the other end. Resistor 109 functions to counteract the static current characteristics of an operational amplifier employed as the differential comparator 75. This static current is typically called the offset current.

Error amplifier 80 with the input signal applied to the inverting input terminal 83 and with the output signal available at terminal 111 has its offset voltage counteracted by the bias produced at the non-inverting terminal 112. This bias counteracting the offset voltage is produced by resistor 113, connected to a source of positive voltage V2 at terminal 115 and with the other end of resistor 113 connected in common with one end of resistor 114 and terminal 112 of amplifier 80, the other end of resistor 114 being returned to ground. The output error signal from error amplifier 80 available at terminal 111 is applied through diode 115 and conductor 116 to the base of an emitter follower which is comprised of a transistor 117. The collector of transistor 117 is connected to a source of DC potential V2 via terminal 118. Conductor 116 which connects the base of transistor 117 to diode 115 is also connected to one side of capacitor 121 having the other side connected to ground.

The error signal, which flows from the emitter of transistor 117 through resistor 120 to common junction point 119, is applied through the DC coupling circuit 87 comprising resistor 122. The signal is then applied through conductor 123 to resistor 107 and via paths 78 to first storage means 81 and the non-inverting terminal 82 of the differential comparator 75.

The error signal from common junction point 119 is also applied to the second storage means 84 which is comprised of a capacitor 124 with the other end returned to ground. The output error signal available at common junction point 119 is also applied to the output terminal 89 and is applied through the conductor 126 to the movable contact 127 connected to terminal 128 of the time constant adjusting switch shown generally as 129.

In addition to switch 129 the time constant adjusting circuit includes resistors 132 and 133 which are connected to terminals 130 and 131 respectively, the other ends of resistors 132 and 133 are connected to ground. The DC analog output signal representative of the peak pulse amplitude from the ultrafast peak pulse converter is available for use with other equipment, such as recorders, etc., through terminals 89. The return path to ground is provided through terminal 134.

The function of the components related to the input circuit, the differential comparator, the fast charge circuit including diode 77 and the first storage means 81 have already been described. Diode 115 functions to unidirectionally couple the output error signal from the error amplifier 80 to the base of transistor 117. Capacitor 121 stretches the time constant of the pulse error signal helping to insure that the charge which forms on the second storage means 84 accurately represents the peak amplitude of the applied signal. Transistor 117 is a booster amplifier which provides all of the power necessary to charge capacitor 124 without significantly loading the output of the operational amplifier functioning as the error signal amplifier 80. Resistor 120 in the output circuit of the emitter follower 117 functions as a parasitic suppressor and reduces the ringing and noise signals resulting from the transient nature of the signals. Capacitor 124 provides long time storage for the error signal, thus being one of the prime components required in converting the pulse signals to DC analog signals. Resistor 122 functions to DC couple the signals stored on capacitor 124 to the noninverting input terminal 82 via resistor 107 of differential comparator 75. Switch 127 and the associated resistors 132 and 133 permit the adjustment of the time constant performed by the second storage means 85 including capacitor 124.

In the preferred embodiment of the peak pulse converter shown in the schematic of FIG. 5, typical component values are provided in the listing to follow.

| Component Values | | |
|---|---|---|
| Component | Value | |
| Resistor | | |
| 103 | 3.3 | megohms |
| 104 | 470 | ohms |
| 107 | 100 | ohms |
| 109 | 3.3 | megohms |
| 113 | 150,000 | ohms |
| 114 | 100 | ohms |
| 120 | 4.7 | ohms |
| 122 | 47 | ohms |
| 132 | 10,000 | ohms |
| 133 | 100,000 | ohms |
| Capacitors | | |
| 102 | .03 | uf |
| 108 | 10 | pf |
| 121 | 300 | uf |
| 124 | 1.0 | uf |
| Diodes | | |
| 77 | 1N4375 | — |
| 115 | 1N914B | — |
| Operational Amplifiers | | |
| 75 | UA760 | — |
| 80 | UA760 | — |
| Transistor | | |
| 117 | 2N4275 | — |

Figure 6:
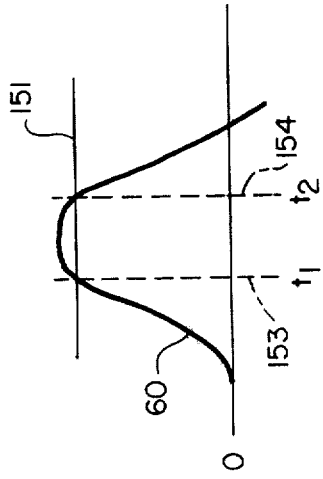
FIG. 6 is a waveform diagram of a single idealized pulse showing time and amplitude characteristics in connection with the circuit of FIG. 5.

The prior art portion of the circuit shown in FIG. 5 consists of input circuit 74, differential comparator 75, pass charging circuit including diode 77 and first storage means 81. The circuit operates to produce a signal whose pulse width is proportional to the difference between the amplitude of the signal applied to the inverting input terminal 88 and the signal stored by first storage means 81. The signal stored by first storage means 81 is applied to the non-inverting input terminal 82 of differential comparator 75. Referring to FIG. 6, with a signal stored in the first storage means 81, having a value represented by the horizontal line 151, and with the applied pulse represented by the solid line 60, the differential amplifier 75 will produce a signal at the output terminal 106 at time T1 as represented by the vertical dotted line 153. The output signal at terminal 106 will continue until the time T2 as represented by vertical dotted line 154 at which time the output signal is terminated. Thus, the function of the input circuit 74, the differential comparator 75, and the first storage means 81 is to provide an output signal at terminal 106 for that period of time during which the pulse applied to the input terminal 88 exceeds the signal stored by capacitor 108 of first storage means 81. The amplitude of the output signal at terminal 106 is determined by the maximum output voltage of the differential comparator 75 and is not determined by the amplitude of the applied signal.

The operation of the same input circuit 74, differential comparator 75, diode 77 and first storage means 81 may be explained in terms of logic signals. That is, when a signal is applied to the inverting input terminal 88, the first storage means connected to the non-inverting terminal 82 is charged to the peak value of the signal applied through diode 77. The charge stored by the first storage means 81 then provides an input bias current at the non-inverting terminal 82, which discharges the first storage means to slightly below peak signal. At the peak of the following cycle, the input signal at terminal 88 will exceed the stored charge at terminal 82, causing the output to go high. With the output signal high, diode 77 furnishes an additional charge signal to the first storage means 81 which then reduces or eliminates the difference signals between the two input terminals 82 and 88, which causes the output signal to go low again.

Figure 7:
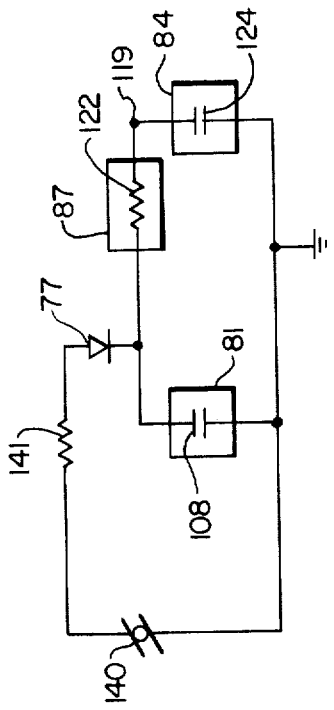
FIG. 7 is a schematic diagram of an equivalent circuit to FIG. 5, shown for purposes of explanation.

The novel combination comprising the DC coupling circuit 87 and the first and second storage means 81 and 84, respectively, provide unexpected results when used in the operation of the present invention and will therefore be explained in more detail. FIG. 7 is a schematic of a circuit equivalent to that portion of the schematic of FIG. 5 which contains the differential comparator 75, diode 77, first storage means 108, parasitic suppressor 107, DC coupling resistor 122 and second storage means 84. By "equivalent circuit" is meant a circuit which performs the same, both theoretically and practically, but lends itself more rapidly to analysis.

In this equivalent circuit as seen in FIG. 7, signal generator 140 represents the signal output of differential comparator 75, and resistor 141 represents the internal impedance of differential comparator 75. All other components of FIG. 7 represent the same components of FIG. 5 and bear the same identifying numbers.

The connection to the input of error amplifier 80, which is terminal 83 in FIG. 5, is omitted from FIG. 7 since the input impedance of this amplifier is very high and has little relation to the operation of the equivalent circuit of FIG. 7. Similarly, the input impedance at the noninverting terminal 82 has little effect on the operation of the equivalent circuit of FIG. 7 in this analysis and the connection is therefore not shown. Furthermore, the parasitic suppressor 107 has little effect on the signal operation of the converters so has been omitted in FIG. 7.

In the analysis of the circuit of FIG. 7, an assumption has been made that the effective output impedance of differential comparator 75 (generator 140) as represented by resistor 141 has a value of 141 ohms. This value is conveniently chosen because it is exactly three times the value of the DC coupling resistor 122, which, as shown in the table, has a value of 47 ohms. The output impedance of this type of operational amplifier used as a differential comparator is typically 150 ohms, so an assumption of 141 ohms is a reasonably valid assumption.

Examining the waveform developed at point 142 by a pulse generated by signal generator 140 applied to resistor 141, which represents the internal impedance of the differential comparator 75. Initially, some small part of one nanosecond after the pulse is applied, the voltage at point 142 is still zero since the function of both first and second storage means, i.e., capacitors 108 and 124, is to resist change. At $T = 10 \times 141 \times 10^{-15}$, the time constant of resistor 141 and capacitor 124, the voltage at point 142 attempts to rise to a value of approximately 66% of the applied voltage. However, the time constant of capacitor 124 and 122 is so long relative to the time constant of capacitor 108 and resistor 141, i.e., the time constant of resistor 122 and capacitor 124 is $47 \times 1 \times 10^{-6}$, that the voltage at capacitor 124 will not rise until the pulse applied at the input by way of signal generator 140 has risen past its peak and decreased to essentially zero value. Since it is not possible, at least initially, for the signal applied to capacitor 124 to rise significantly while capacitor 108 is being charged, the end of resistor 122 connected to the top of capacitor 124 may be considered as substantially at ground potential.

With this end of resistor 122 substantially at ground potential, resistors 141 and 122 act as a divider, and determine that the voltage applied to capacitor 108 is essentially one-fourth, determined by the ratio of the resistance value of 122 to the sum of resistor values 141 and 122, is applied to charge capacitor 108. Thus, the first observation of note is that while resistors 141 and 122 determine the amplitude of the volts applied to capacitor 108, capacitor 124 does not prohibit capacitor 108 from charging to the peak value of the signal applied to the resistor network, As previously described, the operation of the total circuit of the comparator as shown in FIG. 5 is to increase the charge on capacitor 124 by applying a signal through the error amplifier 80 to point 119. Thus, after a number of cycles, i.e., more than one, the charge on capacitor 124 will build up to the peak value of the applied signal and resistors 141 and 122 will no longer act as a divider network thus permitting capacitor 108 to take on the peak value of the applied signal. Again it is noted that the operation of the novel coupling circuit of DC coupling resistor 87 and second storage means 84 does not prohibit the first storage means 81 from taking on a charge equal to the peak value of the applied signals after one or more pulses are applied. It is of course understood that with different values of resistors 141 and 122 the circuit will perform in the same manner but the ratio of the division of the applied signals will be somewhat different at the time of the initial pulse.

Now assuming that a number of pulses have been applied by signal generator 140 to bring both first storage means 81 and second storage means 84 up to the peak value of the applied signal, the operation of the circuit, FIG. 7, is again examined. Under this condition the charge on capacitor 124, which is many times greater than the charge held in capacitor 108, the combined function of storage capacitor 124 and coupling resistor 122 is to maintain the charge on capacitor 108 at its normal peak value. In other words, the time constant of first storage means 81 is short and the time constant of second storage means 84 is very long. Therefore, the charge from the second storage means will effectively operate to keep the first storage means charged.

Thus the second significant observation may be made in regard to the equivalent circuit shown in FIG. 7. That is, while the function of the second storage means does not permit the first storage means from taking on the peak value of the applied signal, the function of the second storage means is to maintain that peak charge on the first storage means after the termination of the applied pulse. It will now be seen that, in the circuits of FIGS. 4 or 5, the initial function of the input circuit 74 and differential comparator 75 in conjunction with the fast storage circuit including diode 77 and first storage means 81 is to produce a signal at the first storage means 81 representative of the peak value of the applied input signal. This same signal is applied from the output of the differential comparator 75 to the input terminal of error amplifier 80 and by means of diode 150, transistor 117 and resistor 120, a signal is applied to the second storage means 124 and this same signal is applied through the DC coupling resistor 122 and parasitic suppressor 107 to the input terminal 82 of comparator amplifier 75 and first storage means 81. By means of these circuits a peak charge is obtained on capacitor 108 of first storage means 81 which is related to the amplitude of the applied peak pulse, and this peak charge is maintained by the action of the second storage means and the DC coupling resistor 122. If at any time an error is detected between the difference between the peak charge stored in capacitor 108 of first storage means 81 and the peak of the applied signal at terminal 88 of the differential comparator 75, a signal is produced at terminal 106 of the differential comparator which functions to increase the charge of both capacitors 108 and 124. Thus, the overall circuit of the ultrafast peak pulse detector is to produce at terminal 89 a DC analog voltage whose value is accurately related to the peak value of the signal which is applied to terminal 70.

Figure 8:
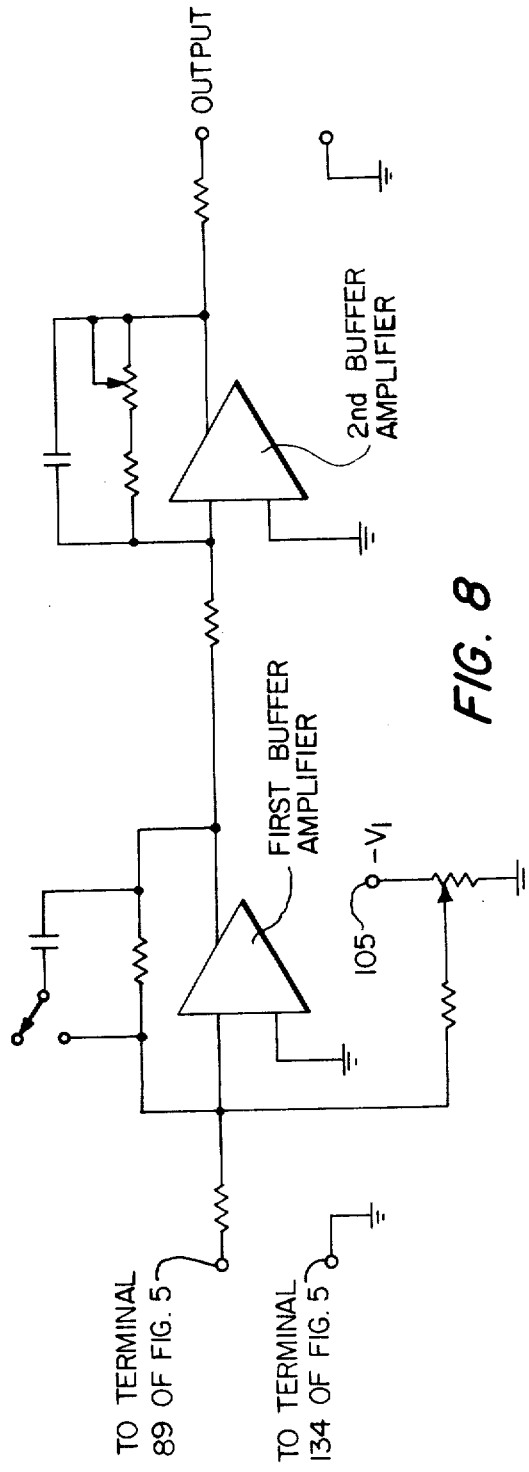
FIG. 8 is a schematic diagram, partly in block form of a buffer amplifier output circuit usable with the present invention.

If it is desired, the output signal from terminal 89 may be coupled through one or more buffer amplifiers to produce a signal well isolated from the output terminal 89. These buffer amplifiers may also include a gain adjustment so that the proportionality of the DC analog voltage may be adjusted relative to the peak amplitude of the applied input signal at terminal 77 of the comparator. The interconnection of two operational amplifiers connected as buffers is shown in FIG. 8 without further comment.

While certain advantageous embodiments have been chosen to illustrate the invention it will be understood by those skilled in the art that various changes and modifications can be made therein without departing from the scope of the invention as defined in the appended claims.

What is claimed is:

1. A pulse peak detector for generating a DC voltage proportional to the peak amplitude of an applied input pulse having a short duration and a fast rise time comprising:
   an input circuit for receiving the applied pulse signal;
   first storage means connected to said input circuit for storing a signal related to the peak amplitude of the applied pulse signal,
   said first storage means and said input circuit having a time constant less than the duration of the applied pulse;
   means connected to said input circuit and to said first storage means for generating an error signal of predetermined amplitude,
   the time duration of said error signal being proportional to the time interval during which the amplitude of the applied signal is greater than the amplitude of the signal stored by said first storage means;
   coupling circuit means connected to said means for generating an error signal;
   second storage means connected to said coupling means for storing a signal whose amplitude is accurately representative of the peak amplitude of the applied signal,
   the time constant of said coupling means and said second storage means being long relative to the repetition rate of the applied signals; and
   DC coupling means for coupling said first storage means to said second storage means whereby charge is exchanged between said second storage means and said first storage means.

2. A pulse peak detector according to claim 1 wherein said first and second storage means comprise capacitors,
and wherein the capacitor comprising said second storage means has a value approximately two orders of magnitude greater than the capacitor of said first storage means.

3. A detector according to claim 1 wherein said means for generating an error signal comprises a differential amplifier having a first input terminal connected to said first storage means and a second input terminal connected to said input circuit.

4. A detector according to claim 1 wherein said coupling means comprises a semiconductor diode.

* * * * *